(12) United States Patent
Tchelnokov et al.

(10) Patent No.: US 10,141,370 B2
(45) Date of Patent: Nov. 27, 2018

(54) OPTOELECTRONIC DEVICE AND METHOD FOR MANUFACTURING SAME

(71) Applicant: Commissariant á l'énergie atomique et aux énergies alternatives, Paris (FR)

(72) Inventors: Alexei Tchelnokov, Meylan (FR); Ivan-Christophe Robin, Grenoble (FR); Bruno Mourey, Coublevie (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/890,917

(22) PCT Filed: May 13, 2014

(86) PCT No.: PCT/FR2014/051112
§ 371 (c)(1),
(2) Date: Nov. 13, 2015

(87) PCT Pub. No.: WO2014/184488
PCT Pub. Date: Nov. 20, 2014

(65) Prior Publication Data
US 2016/0104743 A1    Apr. 14, 2016

(30) Foreign Application Priority Data

May 14, 2013 (FR) ..................................... 13 54285

(51) Int. Cl.
*H01L 27/15* (2006.01)
*H01L 25/16* (2006.01)
(Continued)

(52) U.S. Cl.
CPC ............ *H01L 27/15* (2013.01); *H01L 25/167* (2013.01); *H01L 29/73* (2013.01); *H01L 29/78* (2013.01);
(Continued)

(58) Field of Classification Search
CPC ....... H01L 27/15; H01L 33/24; H01L 33/285; H01L 33/44; H01L 25/167
See application file for complete search history.

(56) References Cited

U.S. PATENT DOCUMENTS

2006/0171135 A1    8/2006 Ishizaka et al.
2007/0139928 A1    6/2007 Wang et al.
(Continued)

FOREIGN PATENT DOCUMENTS

EP    2079279       7/2009
EP    2079279 A2    7/2009
(Continued)

OTHER PUBLICATIONS

European Patent Office, International Search Report for PCT/FR2014/051112, dated Aug. 8, 2014.
(Continued)

*Primary Examiner* — Mark Prenty
(74) *Attorney, Agent, or Firm* — Kevin R. Erdman; Brannon Sowers & Cracraft PC

(57) ABSTRACT

The invention relates to an optoelectronic device (45) including: light-emitting diodes (LED) including semiconductor elements (24); current-limiting components (50), wherein each component is connected in series to one of the semiconductor elements and has a resistance that increases with the strength of the current.

15 Claims, 6 Drawing Sheets

(51) Int. Cl.
  *H01L 33/24* (2010.01)
  *H05B 33/08* (2006.01)
  *H01L 29/73* (2006.01)
  *H01L 29/78* (2006.01)
  *H01L 29/88* (2006.01)
  *H01L 33/00* (2010.01)
  *H01L 33/38* (2010.01)
  *H01L 33/44* (2010.01)
  *H01L 33/08* (2010.01)
  *H01L 33/18* (2010.01)

(52) U.S. Cl.
  CPC ............ *H01L 29/88* (2013.01); *H01L 33/005* (2013.01); *H01L 33/24* (2013.01); *H01L 33/385* (2013.01); *H01L 33/44* (2013.01); *H05B 33/0806* (2013.01); *H01L 33/08* (2013.01); *H01L 33/18* (2013.01); *H01L 2924/0002* (2013.01); *H01L 2933/0033* (2013.01)

(56) References Cited

U.S. PATENT DOCUMENTS

| | | | |
|---|---|---|---|
| 2013/0088867 | A1 | 4/2013 | Chung et al. |
| 2013/0112945 | A1 | 5/2013 | Gilet et al. |
| 2016/0104743 | A1* | 4/2016 | Tchelnokov .......... H01L 25/167 257/91 |

FOREIGN PATENT DOCUMENTS

| | | |
|---|---|---|
| WO | 2011019856 | 2/2011 |
| WO | 2011019856 A1 | 2/2011 |
| WO | 2012035243 | 3/2012 |
| WO | 2012035243 A1 | 3/2012 |
| WO | 2012068687 | 5/2012 |
| WO | 2012068687 A1 | 5/2013 |

OTHER PUBLICATIONS

International Searching Authority, Written Opinion, PCT/FR2014/051112, dated Nov. 14, 2015.

* cited by examiner

OPTOELECTRONIC DEVICE AND METHOD FOR MANUFACTURING SAME

CROSS-REFERENCE TO RELATED APPLICATIONS

The present application is a National Stage of PCT International Application Serial Number PCT/FR2014/051112, filed May 13, 2014, which claims priority under 35 U.S.C. § 119 of French Patent Application Serial Number 13/54285, filed May 14, 2013, the disclosures of which are incorporated by reference herein.

BACKGROUND

The present invention generally relates to semicon-ductor materials, to devices based on semiconductor materials, and to the manufacturing methods thereof. The present invention more specifically relates to devices comprising three-dimensional elements, and especially semiconductor microwires or nanowires.

DISCUSSION OF RELATED ART

Examples of microwires or nanowires comprising a semi-conductor material are microwires or nanowires based on a component mainly containing a group-III element and a group-V element (for example, gallium nitride GaN), called III-V com-pound hereafter, or mainly containing a group-II element and a group-VI element (for example, zinc oxide ZnO), called II-VI compound hereafter. Such microwires or nanowires enable to manufacture semiconductor devices such as optoelectronic devices.

Term "optoelectronic devices" is used to designate devices capable of converting an electric signal into an electromagnetic radiation, and particularly devices dedicated to emitting an electromagnetic radiation.

Examples of optoelectronic devices comprise light-emitting diodes comprising three-dimensional elements, particularly semiconductor microwires or nanowires, formed on a substrate. In operations, the microwires or nanowires are connected in parallel. Each light-emitting diode theoretically conducts a current having the same intensity and emits the same quantity of light. However, the electric properties of microwires or nanowires may be slightly different from one wire to the other. Certain microwires or nanowires may then conduct more current than others. A runaway phenomenon may occur. Indeed, microwires or nanowires crossed by a larger current then tend to heat up more, which decreases their resistance and increases the current that they conduct. Finally, part only of all the light-emitting diodes effectively takes part in the emission of light.

SUMMARY

Thus, an embodiment provides an optoelectronic device comprising: light-emitting diodes comprising semiconductor elements; current-limiting components, each component being series-connected with one of the semiconductor elements.

According to an embodiment, each component comprises at least first and second tunnel diodes, the cathode of the first tunnel diode being connected to the cathode of the second tunnel diode or the anode of the first tunnel diode being connected to the anode of the second tunnel diode.

According to an embodiment, each component comprises at least one resonant tunnel diode.

According to an embodiment, each component comprises at least one bipolar transistor.

According to an embodiment, each component comprises at least one MOS transistor.

According to an embodiment, each semiconductor element comprises a microwire or a nanowire.

According to an embodiment, the device further comprises, for each microwire or nanowire, an insulating portion surrounding a portion of the microwire or nanowire and a conduc-tive portion surrounding the insulating portion.

According to an embodiment, the device further comprises: a doped semiconductor substrate of a first conductivity type; pads on a surface of the substrate, each semiconductor element being in contact with one of the pads.

According to an embodiment, the pads are doped with a second conductivity type opposite to the first conductivity type, each semiconductor element being doped with the first conductivity type.

According to an embodiment, the substrate is made of a first semiconductor material selected from the group comprising silicon, germanium, silicon carbide, a III-V compound, a II-VI compound, and a combination of these compounds.

According to an embodiment, each semiconductor element comprises at least a portion mainly comprising a second semi-conductor material in contact with one of the pads, the semiconductor material being selected from the group comprising silicon, germanium, silicon carbide, a III-V compound, a II-VI compound, and a combination of these compounds.

According to an embodiment, the pads are made of a material selected from the group comprising aluminum nitride, boron nitride, silicon carbide, magnesium nitride, magnesium gallium nitride, or of a combination thereof and of their nitrided compounds.

According to an embodiment, each semiconductor element is at least partially covered with a semiconductor structure capable of emitting light.

An embodiment provides a method of manufacturing an optoelectronic device, comprising the steps of: forming light-emitting diodes comprising semiconductor elements; and forming current-limiting components, each component being series-connected with one of the semiconductor elements.

According to an embodiment, the method further comprises the steps of: forming a first electronic circuit comprising the light-emitting diodes; forming a second electronic circuit comprising said components; and attaching the first electronic circuit to the second electronic circuit.

BRIEF DESCRIPTION OF THE DRAWINGS

The foregoing and other features and advantages will be discussed in detail in the following non-limiting description of specific embodiments in connection with the accompanying drawings, among which.

DETAILED DESCRIPTION

Figure 1:
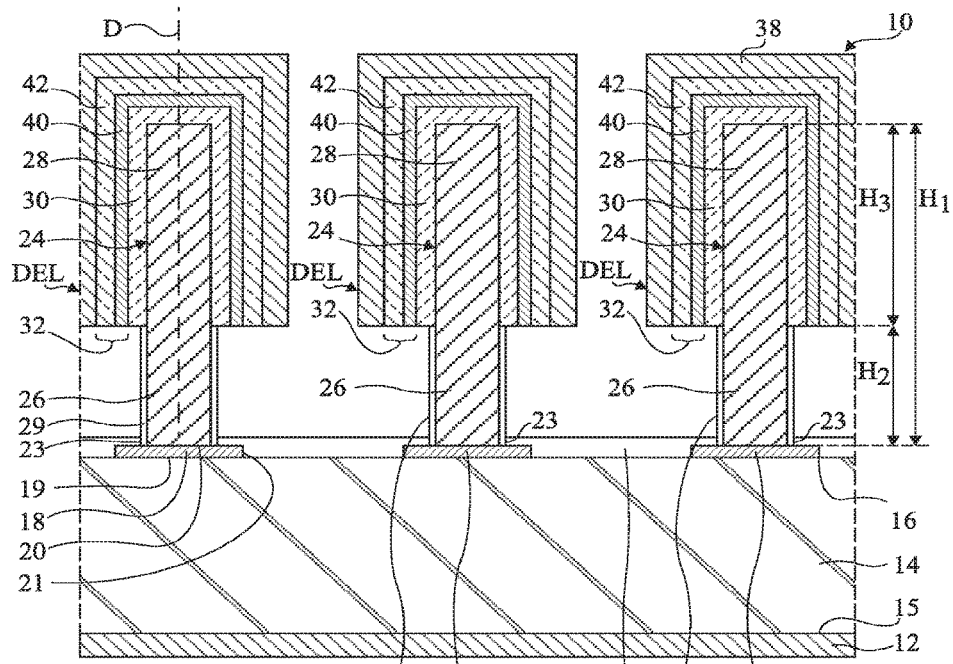
FIG. 1 is a partial simplified cross-section view of an example of an optoelectronic device with microwires or nanowires.

For clarity, the same elements have been designated with the same reference numerals in the various drawings and, further, as usual in the representation of electronic circuits, the various drawings are not to scale. Further, only those elements which are useful to the understanding of the present description have been shown and will be described. In particular, the means for controlling the optoelectronic devices described hereafter are within the abilities of those skilled in the art and are not described.

In the following description, unless otherwise indicated, terms "substantially", "approximately", and "in the order of" mean "to within 10%". Further, "compound mainly formed of a material" or "compound based on a material" means that a compound comprises a proportion greater than or equal to 95% of said material, this proportion being preferably greater than 99%.

In the following description, considering the characteristic variation curve of the current flowing through a component according to the voltage across the component, static resistance $R_{St}^P$ of the component at an operating point P of the characteristic curve corresponding to a voltage U and to a current I is equal to the ratio of voltage U to current I at operating point P and dynamic resistance $R_{Dy}^P$ of the component at operating point P is equal to the ratio of a small variation dU of the voltage around operating point P to the resulting variation dI of the current around operating point P. Unless otherwise indicated, term resistance used alone designates the static resistance.

The present invention relates to optoelectronic devices comprising three-dimensional elements, for example, microwires, nanowires, or pyramid-shaped elements. In the following description, embodiments are described for optoelectronic devices comprising microwires or nanowires. However, these embodiments may be implemented for three-dimensional elements other than microwires or nanowires, for example, pyramid-shaped three-dimensional elements.

Term "microwire" or "nanowire" designates a three-dimensional structure having an elongated shape along a preferred direction, with at least two dimensions, called minor dimensions, in the range from 5 nm to 2.5 µm, preferably from 50 nm to 2.5 µm, the third dimension, called major dimension, being at least equal to 1 time, preferably at least 5 times, and more preferably still at least 10 times, the largest minor dimension. In certain embodiments, the minor dimensions may be smaller than or equal to approximately 1 µm, preferably in the range from 100 nm to 1 µm, more preferably from 100 nm to 300 nm. In certain embodiments, the height of each microwire or nanowire may be greater than or equal to 500 nm, preferably in the range from 1 µm to 50 µm.

In the following description, term "wire" is used to mean "microwire or nanowire". Preferably, the median line of the wire which runs through the centers of gravity of the cross-sections, in planes perpendicular to the preferred direction of the wire, is substantially rectilinear and is called "axis" of the wire hereafter.

The cross-section of the wires may have different shapes, such as, for example, an oval, circular, or polygonal shape, particularly triangular, rectangular, square, or hexagonal. It should thus be understood that term "diameter" mentioned in relation with a cross-section of a wire or of a layer deposited on this wire designates a quantity associated with the surface area of the targeted structure in this cross-section, corresponding, for example, to the diameter of the disk having the same surface area as the wire cross-section.

The wires may at least partly be formed based on at least one semiconductor material. The semiconductor material may be silicon, germanium, silicon carbide, a III-V compound, a II-VI compound, or a combination of these compounds.

The wires may be at least partly formed of semiconductor materials mainly comprising a III-V compound, for example, III-N compounds. Examples of group-III elements comprise gallium (Ga), indium (In), or aluminum (Al). Examples of III-N compounds are GaN, AN, InN, InGaN, AlGaN, or AlInGaN. Other group-V elements may also be used, for example, phosphorus or arsenic. Generally, the elements in the III-V compound may be combined with different molar fractions.

The wires may be at least partly formed based on semiconductor materials mainly comprising a II-VI compound. Examples of group-II elements comprise group-IIA elements, particularly beryllium (Be) and magnesium (Mg), and group-IIB elements, particularly zinc (Zn) and cadmium (Cd). Examples of groupVI elements comprise group-VIA elements, particularly oxygen (O) and tellurium (Te). Examples of II-VI compounds are ZnO, ZnMgO, CdZnO, or CdZnMgO. Generally, the elements in the II-VI compound may be combined with different molar fractions.

In certain embodiments, the wires may comprise a dopant. As an example, for III-V compounds, the dopant may be selected from the group comprising a group-II P-type dopant, for example, magnesium (Mg), zinc (Zn), cadmium (Cd), or mercury (Hg), a group-IV P-type dopant, for example, carbon (C), or a group-IV N-type dopant, for example, silicon (Si), germanium (Ge), selenium (Se), sulfur (S), terbium (Tb), or tin (Sn).

The wires are formed on a substrate. The substrate may correspond to a one-piece structure or correspond to a layer covering a support made of another material. The substrate for example is a semiconductor substrate such as a substrate made of silicon, germanium, silicon carbide, a III-V compound, such as GaN or GaAs, or a ZnO substrate. The substrate may be made of a conductive material, for example, of metal, or of an insulating material, for example, of sapphire, glass, or ceramic.

Pads or islands, also called seed islands hereafter, are formed on a surface of the substrate. The seed islands are made of a material favoring the growth of wires. In the case of seed pads, a treatment is further provided to protect the lateral sides of the seed islands and the surface of the substrate portions which are not covered with the seed islands to form a dielectric region on the lateral sides of the seed islands and extending on top and/or inside of the substrate and connecting, for each pair of pads, one of the pads in the pair to the other pad in the pair, with no wire growth on the dielectric region.

The fact of saying that a compound based on at least one first element and on a second element has a polarity of the first element and a polarity of the second element means that the material grows along a preferred direction and that when the material is cut in a plane perpendicular to the preferred growth direction, the exposed surface essentially comprises atoms of the first element in the case of the polarity of the first element or the atoms of the second element in the case of the polarity of the second element.

The material forming the seed islands is selected to promote the wire growth according to the same polarity. As an example, when the wires mainly comprise a III-V compound, the material forming the seed islands is preferably selected to favor the growth of the III-V compound according to the polarity of the group-V element. The III-V compound then grows along the polarity of the group-V element on the seed islands, from the top of each seed islands, and grows neither on the lateral sides of the seed islands nor on the rest of the substrate. Further, the inventors have shown that each wire then grows according to a substantially constant polarity in the entire wire. When the wires mainly comprise a II-VI compound, the material forming the seed islands is preferably selected to favor the growth of the II-VI compound according to the polarity of the group-VI element. The II-VI compound then grows according the polarity of the group-VI element on the seed islands, from the top of each seed islands, and grows neither on the lateral sides of the seed islands nor on the rest of the substrate.

In the case of a III-V compound where the group-V element is nitrogen, the material forming the islands may be a material favoring the growth of a wire according to the N polarity. As an example, the islands may be made of aluminum nitride (AlN), of boron nitride (BN), of silicon carbide (SiC), of magnesium nitride in MgxNy form, where x is approximately equal to 3 and y is approximately equal to 2, for example magnesium nitride in Mg3N2 form or magnesium gallium nitride (MgGaN), or of a combination thereof and of the nitrided compounds thereof. Preferably, the material forming the seed islands is aluminum nitride.

The wire growth method may be a method such as chemical vapor deposition (CVD) or metal-organic chemical vapor deposition (MOCVD), also known as metal-organic vapor phase epitaxy (MOVPE). However, methods such as molecular-beam epitaxy (MBE), gas-source MBE (GSMBE), metal-organic MBE (MOMBE), plasma-assisted MBE (PAMBE), atomic layer epitaxy (ALE), or hydride vapor phase epitaxy (HVPE) may be used. However, electrochemical methods may be used, for example, chemical bath deposition (CBD), hydrothermal methods, liquid aerosol pyrolysis, or electrodeposition.

As an example, the method may comprise injecting into a reactor a precursor of a group-III element and a precursor of a group-V element. Examples of precursors of group-III elements are trimethylgallium (TMGa), triethylgallium (TEGa), trimethylindium (TMIn), or trimethylaluminum (TMAl). Examples of precursors of group-V elements are ammonia (NH3), tertiarybutylphosphine (TBP), arsine (AsH3), or unsymmetrical dimethylhydrazine (UDMH).

According to an embodiment of the invention, in a first phase of growth of the wires of the III-V compound, a precursor of an additional element is added in excess, in addition to the precursors of the III-V compound. The additional element may be silicon (Si). An example of a precursor of silicon is silane (SiH4).

FIG. 1 is a partial simplified cross-section view of an example of an optoelectronic device 10 formed from wires such as previously described and capable of emitting an electromagnetic radiation.

Device 10 comprises, from bottom to top in FIG. 1:
a first biasing electrode 12;
a semiconductor substrate 14 comprising opposite surfaces 15 and 16, surface 15 being in contact with electrode 12;
seed islands 18 favoring the growth of wires and arranged on surface 16, each island 18 comprising a lower surface 19 in contact with surface 16 of substrate 14, an upper surface 20, opposite to surface 19, and at a distance from surface 19, and lateral surfaces 21, or lateral sides, connecting lower surface 19 to upper surface 20;
an insulating layer 22 extending between seed islands 18 on surface 16 of substrate 14, insulating layer 22 partially covering each seed island 18 and comprising openings 23 which each expose a portion of top 20 of one of seed islands 18;
wires 24 (three wires being shown) of height H1, each wire 24 being in contact with surface 20 of one of islands 18, each wire 24 comprising a lower portion 26, of height H2, in contact with island 18 and an upper portion 28, of height H3, in contact with lower portion 26;
a passivating layer 29 covering the periphery of each lower portion 26;
an active layer 30 covering each upper portion 28;
a semiconductor layer 32 or a stack of semiconductor layers covering each active layer 30; and
a second electrode layer 38 covering each semiconductor layer 32.

Substrate 14 for example is a semiconductor substrate, such as a silicon substrate. Substrate 14 is doped with a first conductivity type, for example, N-type doped. Surfaces 15 and 16 may be planar and parallel. Surface 16 of substrate 14 may be a <100> surface.

Electrode 12 may correspond to a conductive layer which extends on surface 15 of substrate 14. The material forming electrode 12 is, for example, nickel silicide (NiSi), aluminum (Al), aluminum silicide (AlSi), titanium (Ti), or titanium silicide (TiSi). This layer may be covered with another metal layer, for example, gold, copper, or eutectics (Ti/Ni/Au or Sn/Ag/Cu) in the case of a soldering.

Islands 18 are located on surface 16 so that they protrude from surface 16. Top 20 of each island 18 is thus in a different plane than surface 16. Each island 18 has a preferred texturing and, when the material forming each island comprises an alloy of at least two elements, a preferred polarity. Preferred texturing means that the crystals forming islands 18 have a preferred growth direction, which is the same for all islands 18. Preferred polarity means that islands 18 all substantially have the same polarity. This means that when the material forming each island comprises an alloy of at least two elements, when the material is cut in a plane perpendicular to the preferred growth direction of the material, the exposed surface essentially comprises atoms of the same element for each island 18. Each island 18 has the same conductivity type, for example, type N, as substrate 14 to decrease the interface resistance between islands 18 and substrate 14. Each island 18 may have any type of shape, for example rectangular, polygonal, circular, square, or oval.

Islands 18 for example have a thickness in the range from 1 to 100 nanometers, preferably from 1 to 60 nanometers, more preferably from 1 nm to 10 nm, more preferably still from 2 nm to 5 nm. The centers of two adjacent islands 18 may be distant by from 0.5 µm to 10 µm, and preferably by from 1.5 µm to 4 µm. As an example, islands 18 may be regularly distributed on substrate 14. As an example, islands 18 may be distributed in a hexagonal network.

Insulating layer 22 may be made of a dielectric material, for example, silicon oxide ($SiO_2$), silicon nitride ($Si_xN_y$, where x is approximately equal to 3 and y is approximately equal to 4, for example, $Si_3N_4$), aluminum oxide ($Al_2O_3$), hafnium oxide ($HfO_2$), or diamond. As an example, the thickness of insulating layer 22 is in the range from 5 nm to 100 nm, for example, equal to approximately 30 nm.

Each wire 24 has a semiconductor structure elongated along an axis D substantially perpendicular to surface 16. Each wire 24 may have a general elongated cylindrical shape with a hexagonal base. The mean diameter of each wire 24 may be in the range from 50 nm to 2.5 µm and height $H_1$ of each wire 24 may be in the range from 250 nm to 50 µm.

Lower portion 26 of each wire 24 is mainly formed of the III-N compound, for example, gallium nitride, having a doping of the first conductivity type, for example, doped with silicon. The periphery of lower portion 26 is covered with dielectric layer 29, for example SiN, up to height $H_2$ from the end of lower portion 26 in contact with the associated island 18. Height $H_2$ may be in the range from 100 nm to 25 µm. Dielectric material layer 29 has a thickness between one atomic monolayer and 100 nm, preferably between one atomic monolayer and 10 nm.

Upper portion 28 of each wire 24 is for example at least partly made of a III-N compound, for example, GaN. Upper portion 28 may be have a doping of the first conductivity type, or may not be intentionally doped. Upper portion 28 extends up to height H3 which may be in the range from 100 nm to 25 µm.

In the case of a wire mainly made of GaN, the crystal structure of the wire may be of wurtzite type, the wire extending along axis C. The crystal structure of the wire may also be of cubic type.

Active layer 30 is the layer from which most of the radiation provided by device 10 is emitted. According to an example, active layer 30 may comprise confinement means, such as multiple quantum wells. It is for example formed of an alternation of GaN and of InGaN layers having respective thicknesses from 5 to 20 nm (for example, 8 nm) and from 1 to 10 nm (for example, 2.5 nm). The GaN layers may be doped, for example of type N or P. According to another example, the active layer may comprise a single InGaN layer, for example, having a thickness greater than 10 nm.

Semiconductor layer 32 or semiconductor layer stack 32 enables to form a P-N or P-I-N junction with active layer 30 and/or upper portion 28. It enables to inject holes into active layer 30 via electrode 38.

The stack of semiconductor layers 32 may comprise an electron barrier layer 40 formed of a ternary alloy, for example, made of aluminum gallium nitride (AlGaN) or of aluminum indium nitride (AlInN) in contact with active layer 30 and an additional layer 42, to provide a good electric contact between second electrode 38 and active layer 30, for example, made of gallium nitride (GaN) in contact with electronic barrier layer 40 and with electrode 38. Semiconductor layer 42 is doped with the conductivity type opposite to that of portion 28, for example, P-type doped. Electron barrier layer 40 may be of the same conductivity type as semiconductor layer 42.

Second electrode 38 is capable of biasing active layer 30 of each wire 24 and of letting through the electromagnetic radiation emitted by wires 24. The material forming electrode 38 may be a transparent and conductive material such as indium-tin oxide (or ITO), aluminum zinc oxide, or graphene.

Optoelectronic device 10 generally comprises a conductive or semiconductor layer which is connected to all second electrodes 38. Wires 24 are thus connected in parallel. The assembly formed of wire 24 and the associated stack of active layer 30, of semiconductor layers 32, and of electrode 38 forms a light-emitting diode DEL. Theoretically, the structure and the electric properties of light-emitting diodes DEL are identical. Since the same voltage is applied between electrodes 38 and electrode 12, a current having the same intensity flows through each wire 24 so that all light-emitting diodes emit the same amount of light. However, in practice, the electric properties of light-emitting diodes may be slightly different. This may for example concern the knee voltage, the series resistance, or the quality of the electric contacts of each light-emitting diode. The currents flowing through wires 24 are thus generally not exactly identical. This creates an imbalance which self-amplifies. Indeed, a wire 24 conducting a current of higher intensity tends to heat up more. This causes a decrease in the resistance of wire 24 and thus a new increase in the current that it conducts. Finally, most of the current effectively only flows through a small portion of the assembly of nanowires or microwires. A small number of light-emitting diodes effectively takes part in the light emission, the other light-emitting diodes being capable of remaining substantially off.

Thus, an object of an embodiment is to overcome at least part of the disadvantages of optoelectronic devices, particularly comprising microwires or nanowires, and of their previously-described manufacturing methods.

Another object of an embodiment is for each light-emitting diode of the optoelectronic device to conduct a current having substantially the same intensity from one light-emitting diode to the other.

Another object of an embodiment is for each light-emitting diode of the assembly of light-emitting diodes connected in parallel to emit substantially the same quantity of light.

Another object of an embodiment is for light-emitting diodes made of a semiconductor material to be capable of being formed at an industrial scale and at a low cost.

According to an embodiment, it is provided to use, in series with each light-emitting diode, an electronic component based on semiconductor materials playing the role of a current limiter. According to an embodiment, this electronic component has a non-linear resistance which increases along with the current intensity.

Figure 2:
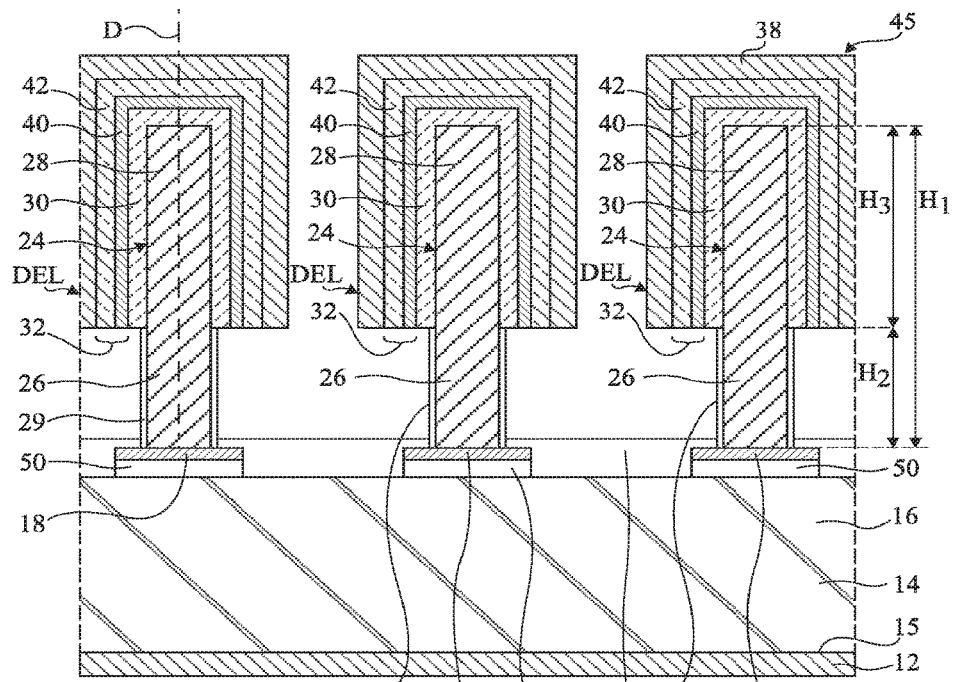
FIG. 2 is a partial simplified cross-section view of an embodiment of an optoelectronic device with microwires or nanowires comprising a current-limiting component.

FIG. 2 is a partial simplified cross-section view of an embodiment of an optoelectronic device 45 formed from wires such as previously described and capable of emitting an electromagnetic radiation.

Optoelectronic device 45 comprises all the elements of optoelectronic device 10 previously described in relation with FIG. 1 and further comprises, for each wire 24, an electronic component 50 arranged at the foot of wire 24, component 50 having a non-linear resistance which, at least over a voltage range, increases along with the current intensity. Thereby, if the intensity of the current flowing through a wire tends to increase, this causes an increase in the resistance of the component 50 associated with wire 24 and thus a decrease in the intensity of the current flowing through the wire. The increase of the resistance of each electronic component 50 during an increase of the current is advantageously selected so that the currents flowing through the light-emitting diodes remain substantially equal and constant. The non-linearities of the resistances of component 50 thus enable to homogenize the currents flowing through the light-emitting diodes. All light-emitting diodes DEL of optoelectronic device 45 thus take part in the emission of a radiation.

In the embodiment shown in FIG. 2, for example wire 24, component 50 is arranged between seed island 18 and substrate 14. According to a variation, component 50 may be arranged between seed island 18 and wire 24. According to another variation, seed island 18 and/or lower portion 26 of the wire may belong to component 50.

According to an embodiment, component 50 comprises a current-vs.-voltage characteristic which comprises a portion having a negative resistance.

Figure 3A:
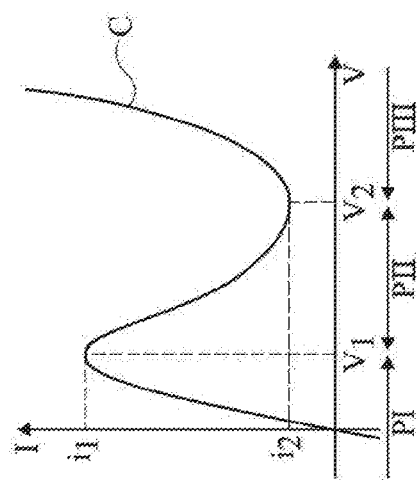
FIGS. 3A and 3B schematically show the variation curve of the current intensity crossing a component with a negative resistance according to the voltage across the component in ideal and real components.
Figure 3B:
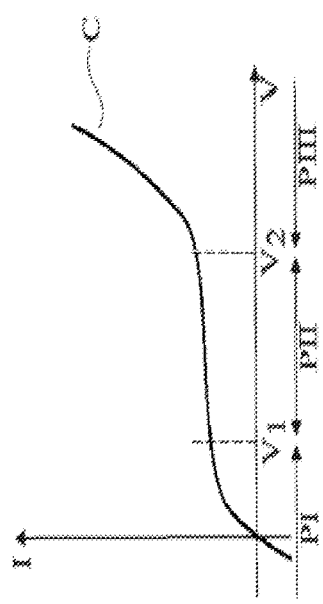

FIGS. 3A and 3B show examples of curve C of variation of the intensity (I) of the current flowing through component 50 according to the voltage (V) across component 50 for ideal (3A) and real (3B) circuits. Curve C comprises:

a first phase PI, when voltage V is in the range from 0 V to $V_1$, where an increase in voltage V causes an increase in intensity I of the current;

a second phase PII, when voltage V is in the range from $V_1$ to $V_2$ where an increase in voltage V causes a decrease in intensity I of the current; and a third phase PIII, when voltage V is greater than $V_2$, where an increase in voltage V causes an increase in intensity I of the current.

The characteristics of component 50 are selected so that, at the operating voltage of the optoelectronic device, the voltage across component 50 is in the range from $V_1$ to $V_2$. The resistance of component 50 then effectively increases along with the intensity of the current between $V_1$ and $V_2$. FIG. 3A shows an ideal embodiment where component 50 is an ideal component which has the theoretical curve I-V shown in FIG. 3A. In the embodiment of FIG. 3B, component 50 is the real component, for which the internal resistances of the global component, in particular the contact series resistances, must be taken into account. In the embodiment of FIG. 3B, curve I-V of the real component having a resistance that increases along with the intensity of the current between $V_1$ and $V_2$ may be obtained since the curve I-V of the theoretical component comprises a portion where the resistance is negative. Thus, FIG. 3A shows the curve I-V of a theoretical component that is modified when the component is integrated in order to obtain what it is disclosed in FIG. 3B, wherein resistance increases along with the intensity of the current between $V_1$ and $V_2$.

According to an embodiment, component 50 comprises at least one tunnel diode.

Figure 4:
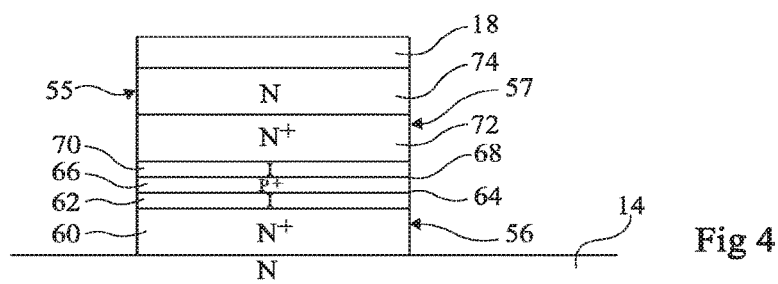
FIGS. 4 and 5 are partial simplified cross-section views of two embodiments of a component with a negative resistance.

FIG. 4 is a partial simplified cross-section view of an embodiment of component 50 where component 50 comprises a stack 55 of two tunnel diodes.

A tunnel diode is a PN semiconductor junction where the P and N semiconductor layers are heavily doped, for example in the order of $10^{19}$ or $10^{20}$ atoms/cm$^3$, and where the thickness of the space charge layer is small, for example, smaller than a few tens of nanometers, for example, in the order of 10 nm or smaller than 10 nm.

According to the present embodiment, stack 55 comprises two series-connected tunnel diodes 56 and 57.

First tunnel diode 56 successively comprises from substrate 14 and all the way to seed island 18:

an N-type doped semiconductor layer 60. Layer 60 for example has a dopant concentration of approximately $2.10^{19}$ atoms/cm$^3$ and a thickness of approximately 100 nm;

a semiconductor layer 62, non intentionally doped. Layer 62 for example has a thickness of approximately 5 nm; and a P-type doped semiconductor layer 66. Layer 66 for example has a dopant concentration of approximately $3.10^{19}$ atoms/cm$^3$ and a thickness of approximately 8 nm.

Tunnel diode 56 may comprise, between semiconductor layer 62 and semiconductor layer 66, a surface 64 P-type doped by delta doping. The doping of surface 64 is for example approximately $10^{14}$ atoms/cm$^2$.

Second tunnel diode 57, formed on first tunnel diode 56, successively comprises:

previously-mentioned semiconductor layer 66;

a semiconductor layer 70, non intentionally doped. Layer 70 for example has a thickness of approximately 4 nm; and an N-type doped semiconductor layer 72. Layer 72 for example has a dopant concentration of approximately $2.10^{19}$ atoms/cm$^3$ and a thickness of approximately 100 nm.

Tunnel diode 57 may comprise, between semiconductor layer 66 and semiconductor layer 70, a surface 68 P-type doped by delta doping. The doping of surface 68 is for example approximately $10^{14}$ atoms/cm$^2$.

Thus, the two tunnel diodes 56, 57 are series-connected with each other and arranged to be "head-to-tail" by comprising semiconductor layer 66 in common. First tunnel diode 57 is thus series-connected with first tunnel diode 56 with a reverse polarity.

Stack 55 may further comprise an N-type doped semiconductor layer 74 covering semiconductor layer 72. Layer 74 for example has a dopant concentration of approximately $10^{18}$ atoms/cm$^3$ and a thickness of approximately 100 nm. This layer forms a buffer layer having seed island 18 formed thereon.

Layers 60, 62, 66, 70, 72, 74 are for example made of silicon.

As a variation, in the case where substrate 14 and lower portion 26 of each wire are P-type doped, the tunnel diode stack 55 may have the structure shown in FIG. 4, with the difference that the N and P polarities of the layers are reversed.

Figure 5:
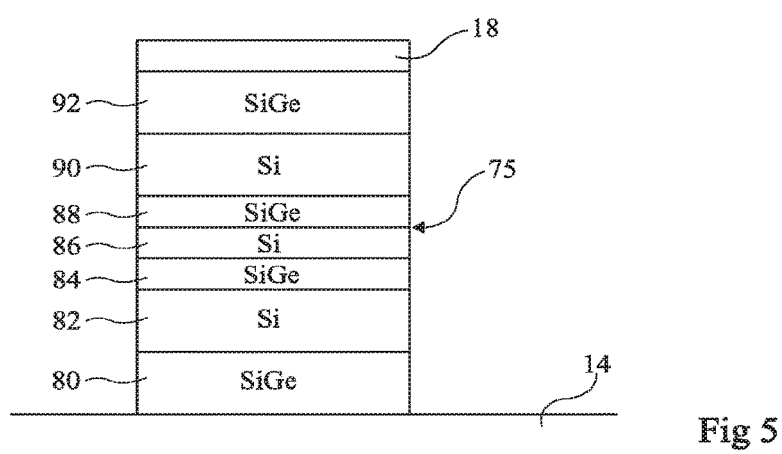

FIG. 5 is a partial simplified cross-section view of an embodiment of component 50 where component 50 comprises a resonant tunnel diode 75. According to the present embodiment, resonant tunnel diode 75 successively comprises, from substrate 14 and all the way to seed island 18:

a layer 80 of an alloy of silicon and germanium. Layer 80 for example has a thickness of approximately 100 nm and a dopant concentration, for example, of type N, of approximately $10^{18}$ atoms/cm$^3$ or more;

a silicon layer 82, non intentionally doped. Layer 82 for example has a thickness of approximately 15 nm;

a non-intentionally doped layer 84 of an alloy of silicon and germanium. Layer 84 for example has a thickness of approximately 7.5 nm;

a silicon layer 86, non intentionally doped. Layer 86 for example has a thickness of approximately 5 nm;

a non-intentionally doped layer 88 of an alloy of silicon and germanium. Layer 88 for example has a thickness of approximately 7.5 nm;

a silicon layer 90, non intentionally doped. Layer 90 for example has a thickness of approximately 15 nm; and a layer 92 of an alloy of silicon and germanium. Layer 92 for example has a thickness of approximately 100 nm and a dopant concentration, for example, of type N, of approximately $10^{18}$ atoms/cm$^3$ or more.

Figures 6, 7:
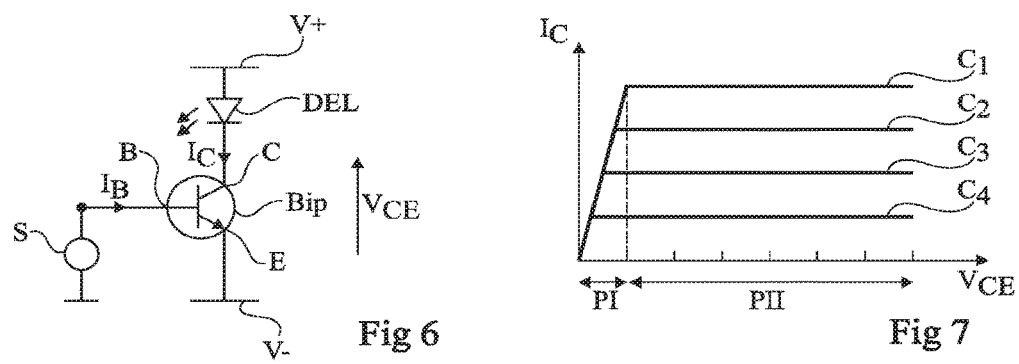
FIG. 6 shows an equivalent electric circuit of a portion of an embodiment of an optoelectronic device with microwires or nanowires comprising a bipolar transistor in series with each light-emitting diode.
FIG. 7 shows variation curves of the collector cur-rent of the bipolar transistor of FIG. 6 according to the collector-emitter voltage for different base currents.

FIG. 6 shows an equivalent electric diagram of another embodiment where component 50 comprises a bipolar transistor Bip series-connected with light-emitting diode DEL. Potential sources V+ and V− correspond to the potential sources intended to be connected, in operation, to electrodes 12 and 38. Collector C of transistor Bip is connected to the cathode of light-emitting diode DEL, emitter E of transistor Bip is connected to voltage source V+, and base B is connected to a current source S. As a variation, the biasing of base B may be performed by any bias circuit, particularly by a voltage source in series with a resistor or by a voltage dividing bridge provided between potential sources V+ and V−.

Bipolar transistor Bip is assembled with a "common emitter". In operation, base B of the transistor is biased so that the bipolar transistor operates in linear mode.

FIG. 7 schematically shows curves $C_1$, $C_2$, $C_3$, and $C_4$ of the variation of current $I_C$ at the collector of bipolar transistor Bip according to voltage $V_{CE}$ between the collector and the emitter for different values of base current $I_B$. Each curve comprises a first portion PI, called saturation state, where collector current $I_C$ strongly increases with voltage $V_{CE}$, followed by a second portion PII, called linear state, where collector current $I_C$ only very slightly depends on voltage $V_{CE}$. In linear state, the dynamic resistance of transistor Bip is very large and the transistor acts as a current stabilizer. The resistance of bipolar transistor Bip then effectively increases with the intensity of the current in linear state. The stabilized current value is controlled by the base current.

Figure 8:
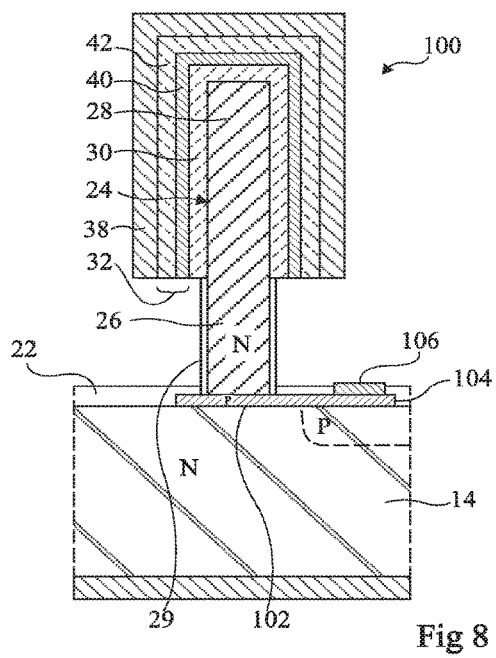
FIG. 8 is a partial simplified cross-section view of an embodiment of an optoelectronic device having the equivalent electric circuit of FIG. 6.

FIG. 8 is a partial simplified cross-section view of an embodiment according to the invention of an optoelectronic device 100 formed from wires such as previously described and capable of emitting an electromagnetic radiation and for which the equivalent electric diagram associated with each wire is shown in FIG. 6.

Optoelectronic device 100 comprises all the elements of optoelectronic device 10 previously described in relation with FIG. 1, with the difference that each seed island 18 of optoelectronic device 10, which has the same type of dopants as substrate 14 and lower portion 26 of wire 24, is replaced with a seed island 102 having a dopant type opposite to the dopant type of substrate 14 and of lower portion 26 of wire 24. Thereby, if substrate 14 and lower portion 26 are N-type doped, seed island 102 is P-type doped. The materials forming seed island 102 may be identical to those previously described for seed island 18.

As an example, the dopant concentration of substrate 14 is from $10^{18}$ to $10^{20}$ atoms/cm$^3$, the dopant concentration of lower portion 26 of the wire is from $10^{18}$ to $10^{19}$ atoms/cm$^3$, and the dopant concentration of seed island 102 is from $10^{17}$ to $10^{18}$ atoms/cm$^3$.

Seed island 102 may comprise a laterally-extending portion 104. A conductive pad 106 may be provided in contact with portion 104. Conductive pad 106 is intended to be connected to current source S. A P-type doped region 104 may be provided under portion 104 of seed island 102 to insulate it from the rest of substrate 14.

Substrate 14 corresponds to emitter E of bipolar transistor Bip, seed island 102 corresponds to base B of bipolar transistor Bip, and lower portion 26 of wire 24 corresponds to collector C of bipolar transistor Bip.

As an example, for an optoelectronic device 100 for which substrate 14 is made of N-type doped silicon with $5.10^{19}$ atoms/cm$^3$, seed island 102 is made of P-type doped silicon carbide with $10^{17}$ atoms/cm$^3$, and lower portion 26 of the GaN nanowire is made of N-type doped $5.10^{18}$ atoms/cm$^3$ and with a base current $I^B$ in the order of one nanoampere, collector current $I^C$ is substantially stable at 2 microamperes for an emitter-collector voltage greater than 0.3 V.

Figure 9:
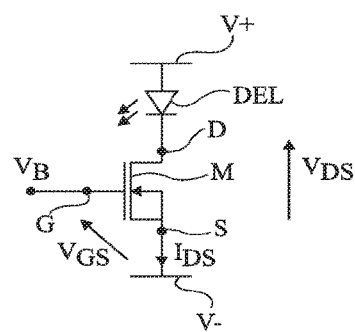
FIG. 9 shows an equivalent electric circuit of a portion of an embodiment of an optoelectronic device with microwires or nanowires comprising a field-effect transistor in series with each light-emitting diode.

FIG. 9 shows an equivalent electric diagram of another embodiment where component 50 comprises a metal-oxide gate field-effect transistor, or MOS transistor, M, series-connected with light-emitting diode DEL. Drain D of transistor M is connected to the cathode of light-emitting diode DEL and source S of transistor M is connected to potential source V−. The gate of the MOS transistor is connected to a source of a reference potential VB. Transistor M is assembled with a "common source". In operation, gate G of transistor M is biased so that transistor M operates in saturation state.

Figure 10:
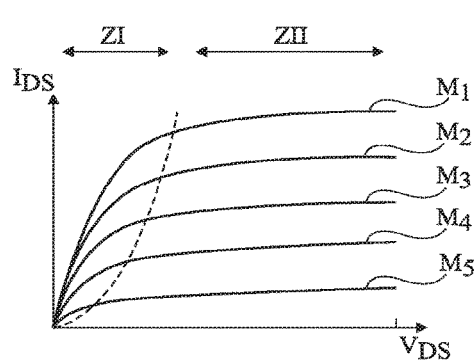
FIG. 10 shows variation curves of the drain-source current of the field-effect transistor of FIG. 9 according to the drain-source voltage for different gate-source voltages.

FIG. 10 schematically shows curves $M_1$, $M_2$, $M_3$, $M_4$, and $M_5$ of the variation of drain-source current $I_{DS}$ of transistor M according to voltage $V_{DS}$ between the drain and the source of transistor M for different values of voltage $V_{GS}$ between the gate and the source. Each curve comprises a first portion ZI, called linear state, where drain-source current $I_{DS}$ strongly increases with voltage $V_{DS}$, followed by a second portion ZII, called saturation state, where drain-source current $I_{DS}$ only very slightly depends on voltage $V_{DS}$. In saturation state, the dynamic resistance of transistor M is very large and the transistor acts as a current stabilizer. The resistance of transistor M then effectively increases with the intensity of the current in saturation state. The value of the stabilized current is controlled by the gate-source voltage.

Figure 11:
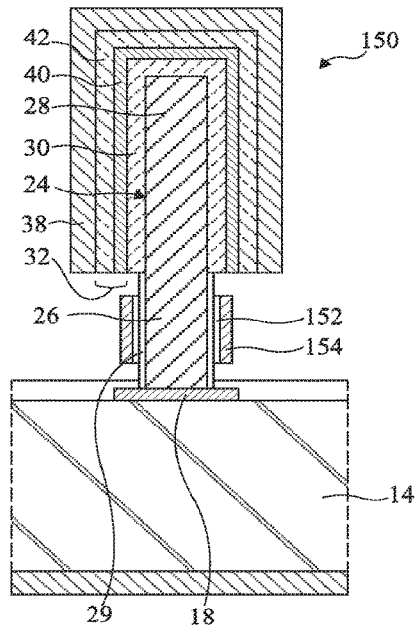
FIG. 11 is a partial simplified cross-section view of an embodiment of an optoelectronic device having the equivalent electric circuit of FIG. 9.

FIG. 11 is a partial simplified cross-section view of an embodiment according to the invention of an optoelectronic device 150 formed from wires such as previously described and capable of emitting an electromagnetic radiation and for which the equivalent electric diagram associated with each wire is shown in FIG. 9.

Optoelectronic device 150 comprises all the elements of optoelectronic device 10 previously described in relation with FIG. 1 and further comprises an insulating portion 152 around lower portion 26 of each wire 24, and a conductive portion 154 around insulating portion 152. Conductive portion 154 is intended to be connected to potential source $V_B$. As a variation, in the case where the thickness of insulating layer 29 is sufficient, insulating portion 152 may not be present.

The area of lower portion 26 which is surrounded with insulating portion 152 corresponds to the channel of transistor M. Substrate 14, seed island 18, and the area of lower portion 26 in contact with seed island 18 and which is not surrounded with insulating portion 152 corresponds to source D of transistor M. Upper portion 28 of wire 24 and the area of lower portion 26 of wire 24 which is in contact with upper portion 28 and which is not surrounded with insulating portion 152 corresponds to drain D of transistor M. Conductive portion 154 corresponds to gate G of transistor M.

As an example, for an optoelectronic device 150 for which lower portion 26 of the GaN nanowire is N-type doped with $5.10^{18}$ atoms/cm$^3$ and has a 1-µm diameter, for which gate oxide 152 is made of hafnium oxide HfO$_2$, has a 3-nm thickness and extends along a wire height of 500 nm, a stabilization of drain-source current $I_{DS}$ at 1 µA is obtained for a 3.5-V drain-source voltage when a negative 10-V voltage is applied to gate 154.

In the previously-described embodiments, components 50 are provided at the foot of wires 24. They are thus formed before the forming of wires 24 or partly during the forming of wires 24. According to another embodiment, the light-emitting diodes are formed on a first support and components 50 playing the role of current limiters are formed on a second support different from the first support. The first support is then attached to the second support so that each component playing the role of a current limiter is series-connected with one of the light-emitting diodes. The first or the second support may then be suppressed.

Figure 12A:
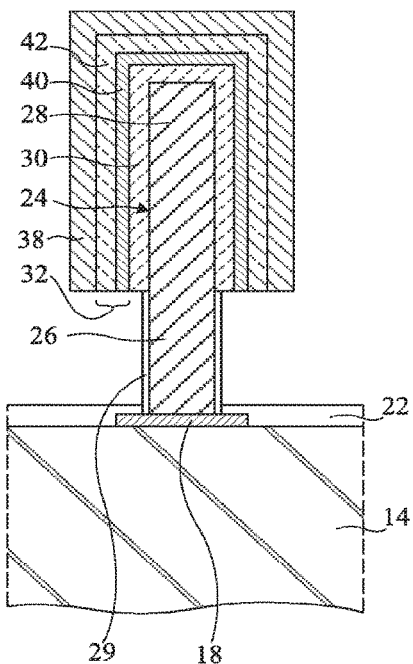
FIGS. 12A to 12E are partial simplified cross-section views of the structures obtained at successive steps of another embodiment of a method of manufacturing an opto-electronic device comprising microwires or nanowires.

FIGS. 12A to 12E illustrate the structures obtained at steps of an embodiment of a method of manufacturing an optoelectronic device using two different supports. The embodiment of the manufacturing method comprises the steps of:

(1) forming on substrate 14, for each wire 24, seed island 18, wire 24, active layer 30, semiconductor layers 32, and electrode 38 (FIG. 12A).

Figure 12B:
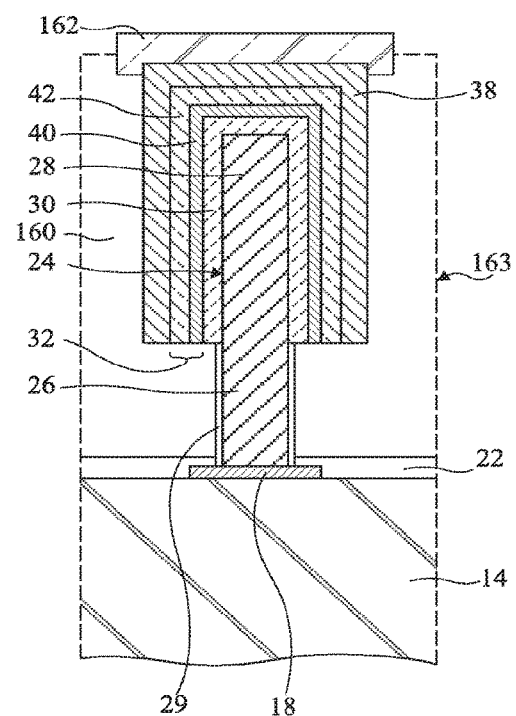

(2) forming an insulating portion 160 which extends all along the height of wire 24 and forming a conductive pad 162 in contact with electrode 38 at the top of wire 24 (FIG. 12B). Insulating portion 160 may be made of silicon oxide or of silicon nitride. Conductive pad 162 may be made of ITO, of nickel, of silver, or may correspond to a multilayer structure for example comprising a copper layer covered with a nickel, silver, or aluminum layer. A first electronic circuit 163 is thus obtained.

Figure 12C:
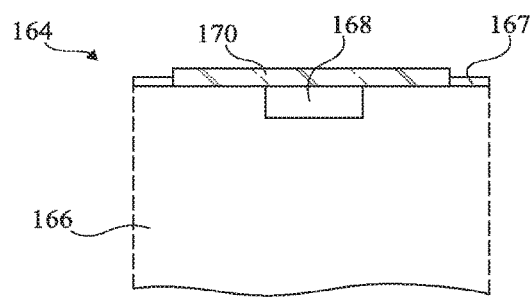
Figure 12D:
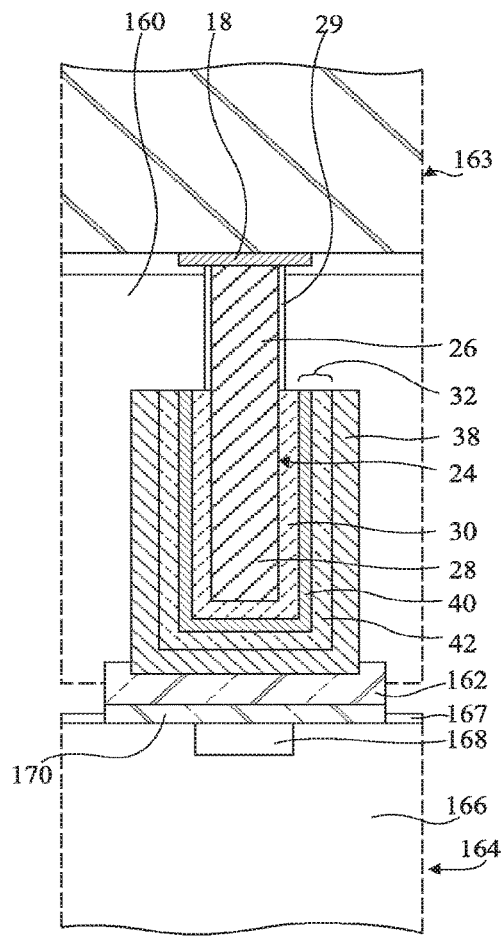
Figure 12E:
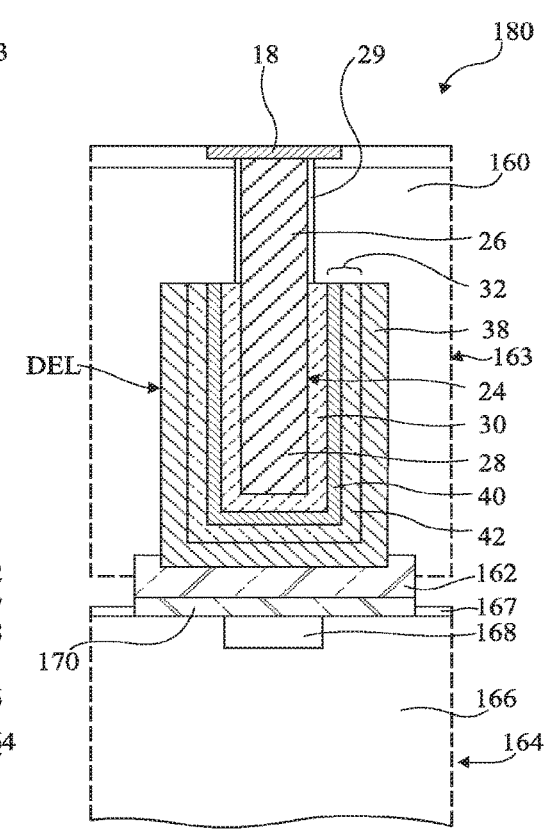

(3) forming, simultaneously to step (1) and/or (2), a second electronic circuit 164 (FIG. 12C). Electronic circuit 164 comprises a support 166 covered with an insulating layer 167. Circuit 164 further comprises, for each wire 24, a component 168 playing the role of a current limiter, and a conductive pad 170 at the surface of support 166 and connected to component 168. Support 166 may be made of a semiconductor material, for example, silicon. Component 168 may correspond to one of the previously-described examples of component 50, particularly, a tunnel diode, a bipolar transistor, or a MOS transistor. Insulating layer 167 may for example be made of silicon oxide or of silicon nitride. Conductive pad 170 may be made of gold or may correspond to a multilayer structure for example comprising a copper layer covered with a nickel, silver, or aluminum layer.

(4) attaching, for example, by molecular bonding or by soldering, first electronic circuit 163 to second electronic circuit 164 (FIG. 12D) so that each conductive pad 162 is connected to one of conductive pads 170.

(5) removing substrate 14 (FIG. 12E) from electronic circuit 163, for example, by chem.-mech. polishing to expose seed islands 18. An optoelectronic device 180 is thus obtained. The method may comprise successive steps of forming a transparent or semitransparent electrode, for example, made of ITO, connected to seed islands 18 and an electrode on the surface of substrate 166 opposite to light-emitting diodes DEL. Light-emitting diodes DEL of optoelectronic device 180 emits light upwards in FIG. 12E. As a variation, the chem.-mech. polishing step may be carried out to expose lower portions 26 of wires 24. A transparent or semitransparent electrode, for example, made of ITO, may then be deposited in contact with lower portions 26.

Specific embodiments of the present invention have been described. Various alterations, modifications, and improvements will readily occur to those skilled in the art.

Indeed, although in the previously described embodiments, active layer 30 surrounds upper portion 28 of each wire 24, the active layer may only cover the top of the wire.

Further, although the drawings show embodiments where the wires, covered with a first electrode, are formed on a first surface of a support while a second electrode is formed on a second surface of the support, opposite to the first surface, it should be clear that the second electrode may be provided on the side of the first surface.

Further, although, in the previously-described embodiments, each wire 24 comprises a passivated portion 26 at the base of the wire in contact with top 20 of a seed island 18, passivated portion 26 may be absent.

The invention claimed is:

1. An optoelectronic device comprising:
   a plurality of light-emitting diodes comprising semiconductor elements; and
   current-limiting components, each said component being series-connected with a corresponding one of the plurality of semiconductor elements and having a resistance which increases along with current intensity flowing through the corresponding series-connected current-limiting component and semiconductor element.

2. The optoelectronic device of claim 1, wherein each component comprises at least first and second tunnel diodes, the cathode of the first tunnel diode being connected to the cathode of the second tunnel diode or the anode of the first tunnel diode being connected to the anode of the second tunnel diode.

3. The optoelectronic device of claim 1, wherein each component comprises at least one resonant tunnel diode.

4. The optoelectronic device of claim 1, wherein each component comprises at least one bipolar transistor.

5. The optoelectronic device of claim 1, wherein each component comprises at least one MOS transistor.

6. The optoelectronic device of claim 1, wherein each semiconductor element comprises a microwire or a nanowire.

7. The optoelectronic device of claim 6, further comprising, for each microwire or nanowire, an insulating portion surrounding a portion of the microwire or nanowire and a conductive portion surrounding the insulating portion.

8. The optoelectronic device of claim 1, further comprising:
   a doped semiconductor substrate of a first conductivity type;
   pads on a surface of the substrate, each semiconductor element being in contact with one of the pads.

9. The optoelectronic device of claim 8, wherein the pads are doped with a second conductivity type opposite to the firsts conductivity type, each semiconductor element being doped with the first conductivity type.

10. The optoelectronic device of claim 8, wherein the substrate is made of a first semiconductor material selected from the group comprising silicon, germanium, silicon carbide, a III-V compound, a II-VI compound, and a combination of these compounds.

11. The optoelectronic device of claim 1, wherein each semiconductor element comprises at least a portion mainly comprising a second semiconductor material in contact with on of the pads, the semi-conductor material being selected from the group comprising silicon, germanium, silicon carbide, a III-V compound, a II-V compound, and a combination of these compounds.

12. The optoelectronic device of claim 8, wherein the pads are made of a material selected from the group comprising aluminum nitride, boron nitride, silicon carbide, magnesium nitride, magnesium gallium nitride, or of a combination thereof and of their nitride compounds.

13. The optoelectronic device of claim 1, wherein each semiconductor element is at least partially covered with a semiconductor structure capable of emitting light.

14. A method of manufacturing an optoelectronic device comprising the steps of:
   forming a plurality of light-emitting diodes comprising semiconductor elements; and
   forming current-limiting components, each said component being series-connected with a corresponding one of the plurality of semiconductor elements and having a resistance which increases along with current intensity flowing through the corresponding series-connected current-limiting component and semiconductor element.

15. The method of claim 14, further comprising the steps of:
   forming a first electronic circuit comprising the light-emitting diodes;
   forming a second electronic circuit comprising said components; and
   attaching the first electronic circuit to the second electronic circuit.

* * * * *